(12) United States Patent
Dussarrat et al.

(10) Patent No.: US 8,613,976 B2
(45) Date of Patent: *Dec. 24, 2013

(54) METHOD OF FORMING SILICON OXIDE CONTAINING FILMS

(75) Inventors: Christian Dussarrat, Wilmington, DE (US); Ikuo Suzuki, Tsukuba (JP); Kazutaka Yanagita, Tsukuba (JP); Julien Gatineau, Tsuchiura (JP); Eri Tsukada, Tokyo (JP)

(73) Assignee: L'Air Liquide, SociétéAnonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/547,876

(22) Filed: Jul. 12, 2012

(65) Prior Publication Data

US 2012/0276292 A1 Nov. 1, 2012

Related U.S. Application Data

(63) Continuation of application No. 11/908,707, filed as application No. PCT/EP2006/060829 on Mar. 17, 2006, now Pat. No. 8,227,032.

(30) Foreign Application Priority Data

Mar. 17, 2005 (JP) .................................. 2005-077608

(51) Int. Cl.
*C23C 16/40* (2006.01)
*C23C 16/455* (2006.01)
(52) U.S. Cl.
USPC .............. 427/255.37; 427/248.1; 427/255.28; 427/255.31

(58) Field of Classification Search
USPC ............................ 427/248.1, 255.18–255.19, 427/255.23–255.31, 255.37, 255.395; 438/787, 790
See application file for complete search history.

(56) References Cited

U.S. PATENT DOCUMENTS 3,596,370 A * 8/1971 Gabrail ...................... 361/321.5
4,181,751 A   1/1980 Hall et al.
(Continued)

FOREIGN PATENT DOCUMENTS

JP   54 163792    12/1979
JP    1 143221     6/1989
(Continued)

OTHER PUBLICATIONS

Machine translation of JP 2002-093804, Advanced Industrial Property Network, Japan Patent Office, [online], [retrieved on Feb. 7, 2012]. Retrieved from the Internet: <URL: http://dossier1.ipdl.inpit.go.jp/AIPN/odse_top_dn.ipdl?N0000=7400 >.*

(Continued)

*Primary Examiner* — Yogendra Gupta
*Assistant Examiner* — Dennis Cordray
(74) *Attorney, Agent, or Firm* — Allen E. White; Patricia E. McQueeney

(57) ABSTRACT

A method of forming a silicon oxide film, comprising the steps of:
  providing a substrate into a reaction chamber;
  injecting into the reaction chamber at least one silicon containing compound where the at least one silicon containing compound is bis(diethylamino)silane;
  injecting Oxygen into the reaction chamber and at least one other O-containing gas selected from ozone and water;
  reacting in the reaction chamber by chemical vapor deposition at a temperature below 400 C the at least one silicon containing compound and the at least one oxygen containing gas in order to obtain the silicon oxide film deposited onto the substrate.

7 Claims, 4 Drawing Sheets

(56) References Cited

U.S. PATENT DOCUMENTS

| | | | |
|---|---|---|---|
| 4,592,132 A * | 6/1986 | Lee et al. | 438/637 |
| 4,597,003 A * | 6/1986 | Aine et al. | 428/450 |
| 5,204,141 A | 4/1993 | Roberts et al. | |
| 5,728,602 A | 3/1998 | Bellows et al. | |
| 5,874,368 A | 2/1999 | Laxman et al. | |
| 6,087,262 A * | 7/2000 | Yang et al. | 438/692 |
| 6,100,579 A | 8/2000 | Sonoda et al. | |
| 6,248,397 B1 | 6/2001 | Ye | |
| 6,358,863 B1 | 3/2002 | Desu et al. | |
| 6,391,803 B1 | 5/2002 | Kim et al. | |
| 6,531,412 B2 | 3/2003 | Conti et al. | |
| 6,797,559 B2 * | 9/2004 | Heo et al. | 438/239 |
| 6,930,061 B2 | 8/2005 | Cheung et al. | |
| 7,875,312 B2 | 1/2011 | Thridandam et al. | |
| 8,236,708 B2 * | 8/2012 | Kweskin et al. | 438/790 |
| 2001/0000476 A1 | 4/2001 | Xia et al. | |
| 2002/0000202 A1 | 1/2002 | Yuda et al. | |
| 2002/0018849 A1 | 2/2002 | George et al. | |
| 2002/0052124 A1 | 5/2002 | Raaijmakers et al. | |
| 2003/0183244 A1 | 10/2003 | Rossman | |
| 2004/0018694 A1 | 1/2004 | Lee et al. | |
| 2004/0198069 A1 | 10/2004 | Metzner et al. | |
| 2005/0048204 A1 | 3/2005 | Dussarrat et al. | |
| 2005/0116266 A1 | 6/2005 | Hirano | |
| 2005/0139937 A1 | 6/2005 | Kamiyama et al. | |
| 2005/0142716 A1 | 6/2005 | Nakajima et al. | |
| 2006/0032442 A1 | 2/2006 | Hasebe | |
| 2006/0178019 A1 | 8/2006 | Senzaki et al. | |
| 2006/0286818 A1 | 12/2006 | Wang et al. | |
| 2007/0010072 A1 | 1/2007 | Bailey et al. | |
| 2007/0059491 A1 | 3/2007 | Kawashima et al. | |
| 2007/0281495 A1 | 12/2007 | Mallick et al. | |
| 2008/0081104 A1 | 4/2008 | Hasebe et al. | |
| 2008/0207007 A1 | 8/2008 | Thridandam et al. | |
| 2009/0232985 A1 | 9/2009 | Dussarrat et al. | |
| 2010/0255218 A1 | 10/2010 | Oka et al. | |

FOREIGN PATENT DOCUMENTS

| | | |
|---|---|---|
| JP | 6 132276 | 5/1994 |
| JP | 6 132284 | 5/1994 |
| JP | 9 289209 | 11/1997 |
| JP | 2002 093803 | 3/2002 |
| JP | 2002 093804 | 3/2002 |
| JP | 2002093804 A * | 3/2002 |
| JP | 2003 007700 | 1/2003 |
| JP | 2003 188171 | 7/2003 |
| JP | 2004 165668 | 6/2004 |
| JP | 2004 214304 | 7/2004 |
| JP | 2006 016641 | 7/2004 |
| JP | 2005 26244 | 1/2005 |
| JP | 2005 116727 | 4/2005 |
| JP | 2005 159316 | 6/2005 |
| JP | 2005 191482 | 7/2005 |
| JP | 2007 318142 | 12/2007 |
| JP | 2008 258591 | 10/2008 |
| KR | 10 2002 0096798 | 12/2002 |
| KR | 10 2007 0114393 | 12/2007 |
| KR | 10 2008 0029846 | 4/2008 |
| KR | 10 2009 7019562 | 1/2011 |
| WO | WO 02 027063 | 4/2002 |
| WO | WO 03 046254 | 6/2003 |
| WO | WO 2004 017378 | 2/2004 |
| WO | WO 2004 017383 | 2/2004 |
| WO | WO 2004017383 A2 * | 2/2004 |
| WO | WO 2004 092441 | 10/2004 |
| WO | WO 2005 093126 | 10/2005 |
| WO | WO 2006 097525 | 9/2006 |
| WO | WO 2006 136584 | 12/2006 |
| WO | WO 2007 002040 | 1/2007 |
| WO | WO 2009 039251 | 3/2009 |

OTHER PUBLICATIONS

Dussarrat, C. et al., "Trisilylamine: A C & Cl-free solution for low temperature silicon nitride chemical vapor deposition," MRS Spring Meeting 2003, Symposium D, CMOS Front-End Materials and Process Technology, Apr. 22-24, 2003, p. 94.

Ferguson J.d., et al. "ALD of $SiO_2$ at room temperature using TEOS and $H_2O$ with $NH_3$ as the catalyst." J. Electrochemical Society, vol. 151, No. 8, Aug. 2004, pp. G528-G535.

Kamiyama, S, et al., "Atomic layer deposition of hafnium silicate gate dielectric films using $Hf[N(CH_3)(C_2H_5)]_4$ and $SiH[N(CH_3)_2]_3$ precursors," Electrochemical and Solid-State Letters, 8 (8) pp. G215-G2127 (2005).

Kamiyama, S. et al. "Comparison Between Hf-Silicate Films Deposited by ALD with BDMAS [$SiH_2(N(CH_3)_2)_2$] and TDMAS ($SiH(N(CH_3)_2)_3$] Precursors," Electrochemical and Solid-State Letters, 8 (10) F37-F39 (2005).

Lim, J-W et al., "Low-temperature growth of $SiO_2$ films by plasma-enhanced atomic layer deposition," ETRI Journal, vol. 27, No. 1, Feb. 2005, pp. 118-121.

Widmann, D. "Technologie hochintegrierter Schaltungen, 2. Auflage." 1996, Springer Verlag, pp. 13-21, pp. 62-64.

Related U.S. Appl. No. 11/917,924, filed Dec. 18, 2007.

Related U.S. Appl. No. 12/233,057, filed Sep. 18, 2008.

International Search Report and Written Opinion for corresponding PCT/EP2006/060829, Aug. 31, 2006.

Australian Search Report and Written Opinion for corresponding Singapore application No. SG 2007 06801-8, Oct. 30, 2008.

International Search Report and Written Opinion for related PCT/EP2006/063414, Oct. 19, 2006.

International Search Report and Written Opinion for related PCT/US2008/076810, Dec. 16, 2008.

Hungarian Search Report and Written Opinion for related Singapore application No. SG 201001880-2, Jul. 15, 2011.

* cited by examiner

METHOD OF FORMING SILICON OXIDE CONTAINING FILMS

CROSS REFERENCE TO RELATED APPLICATIONS

This is a continuation application of U.S. application Ser. No. 11/908,707, filed Mar. 17, 2006, which is a 371 of International PCT Application PCT/EP2006/060829, filed Mar. 17, 2006, which claims priority to JP Application No. 2005-007608, filed Mar. 17, 2005, the entire contents of each being incorporated herein by reference.

BACKGROUND

The invention relates to a method of forming silicon oxide containing films using a silicon precursor and an oxidant gas.

In the front end manufacture of CMOS semi-conductor devices, a passivation film such as SiN is formed on the gate electrode of each MOS transistor. This SiN film deposited on top and on side surface of the gate electrodes (such as polycrystalline silicon or metallic layers) in order to increase the breakdown voltage of each transistor.

Attempts have been made to reduce the temperature deposition of such SiN, to reach a temperature which is not higher than 400° C.

However, SiN films deposited at temperatures below 400° C. have usually poorer film qualities. In order to overcome this issue, it has been proposed to use $SiO_2$ films to reinforce SiN film properties ("dual spacer") and thereby make effective electrical barrier layers to improve significantly the device performances. Also, $SiO_2$ films are used as STI (shallow trench insulation), inter layer dielectric (ILD) layers, passivation layers, etch-stop layers and attempts are made to find a deposition process of these $SiO_2$ layers at low temperature, i.e. below 400° C. In the specific case of dual spacer applications, the deposition of a very (20-50 A thick) thin films performed at low deposition temperatures (300° C. at the most), should not lead to the oxidation of the metal electrode and should be perfectly uniform all along the gate, and an atomic layer deposition process is the most suitable such a requirement. As far as the STI applications are concerned, conformal films should be deposited with high deposition rate (several hundred A per minute) below 500° C.

Deposition of silicon oxide films made from silane and oxygen at low temperature using a PECVD reactor have failed up to now for these applications, due to the incorporation of Si—H bonds into the $SiO_x$ film thereby obtained, which may originate with the presence of hydrogen in the silane gas introduced as a precursor gas. The Si—H bonds then probably readily react with an oxygen source in the environment to produce the Si—OH bond.

The presence of such Si—OH bonds increases the risk of having transistors with an increased leakage current, and therefore a reduced breakdown voltage of the related transistors.

The inventors believe that the presence of a large number of hydrogen atoms bonded to the silicon atom in the Si precursor and of oxygen or oxygen containing gas to generate the $SiO_2$ film, probably also generates moisture ($H_2O$) formation which then reacts with Si to make SiOH.

The inventors also believe that the silicon containing compound shall have preferably a high purity regarding hydrogen containing residues to limit $H_2O$ generation, preferably it shall contain less than 100 ppm of $H_2$ or H containing compounds.

SUMMARY

It is a primary object of this invention to provide a method for forming silicon oxide films on a substrate at a temperature of 400° C. or below which prevents or limits the formation of the OH bond during the $SiO_2$ film formation.

According to the invention, there is provided a method of forming a silicon oxide containing film comprising the steps of:

a) providing a substrate into a reaction chamber,
b) injecting into the reaction chamber at least one silicon containing compound selected from the group consisting of:
  aminosilanes having the formula $(R^1R^2N)_xSiH_{4-x}$ wherein $R^1$ and $R^2$ are independently H, $C_1$-$C_6$ linear, branched or cyclic carbon chain and x is comprised between 1 and 4;
  alkoxysilanes or acetoxysilane having the formula:

$Si(OR^1)(OR^2)(OR^3)(OR^4)$, or $(OR^1)(OR^2)(OR^3)SiSi(OR^4)(OR^5)(OR^6)$, or $(OR^1)(OR^2)(OR^3)SiRSi(OR^4)(OR^5)(OR^6)$, or $Si(0-C(=0)-R^1)(0-C(=0)-R^2)(0-C(=0)-R^3)(0-C(=0)-R^4)$, preferably tetra(acetoxy)silane Si $(0-C(=0)-Me)_4$
    wherein R, $R^1$, $R^2$, $R^3$, $R^4$ $R^5$, $R^6$ are independently H, O, $C_1$-$C_6$ linear, branched or cyclic carbon chain;
  silanes having the formula $(SiH_3)_nR$ with n comprised between 1 and 4, R being selected from the group consisting of H, N, O, $CH_2$, $C_2H_4$, $SiH_2$, SiH, Is;
  Tetra(isocyanato)silane $Si(NCO)_4$;
c) injecting into the reaction chamber at least one oxygen containing gas, preferably ozone and/or oxygen and/or moisture (water);
d) reacting at a temperature below 500° C. into the reaction chamber at least one of the silicon containing compounds and at least one of the oxygen containing gases in order to obtain the silicon oxide containing film deposited onto the substrate;
e) repeating steps b) to d) until the desired $SiO_2$ film thickness is obtained.

Preferably, the substrate is heated in the reaction chamber after its introduction, preferably up to the reaction chamber temperature, prior to carrying out steps b), c), d) and/or e).

According to a preferred embodiment of the invention, at least one step b) and/or c) is carried out by discontinued injection of at least one of the compounds and/or gases. For example, pulsed CVD or ALD are carried out in the reaction chamber.

While simultaneous injection of at least one compound and at least one oxygen containing gas may be carried out in the reaction chamber, it is preferred to provide alternate injection in the reaction chamber of at least one compound and at least one oxygen containing gas.

According to another embodiment, at least one compound or the at least one oxygen containing gas is on the surface of the substrate prior to the injection of another compound and/or or at least one oxygen containing gas.

Preferably, each compound and/or oxygen containing gas injection is followed by the injection of a purge gas, such as an inert gas, into the reaction chamber, while more preferably compounds and/or gas injections are repeated until the desired $SiO_2$ containing film thickness is obtained. The pressure inside the reaction chamber shall be preferably below 100 Torr, more preferably below 2 Torr. Preferably, the H content in the $SiO_2$ containing film is less than $8.10^{21}$ atoms/cc.

According to another embodiment, the ozone containing gas is a gas mixture comprising oxygen and ozone with a ratio $O_3/O_2$ below 30% vol., preferably between 5% and 20% vol.

Preferably, the oxygen/ozone gas mixture is diluted into an inert gas, preferably nitrogen.

The silicon containing compound shall comprise less than 100 ppm of $H_2$ and shall be preferably selected from the group consisting of:

(TSA) Trisilylamine $(SiH_3)_3N$
DSO Disiloxane $(SiH_3)_2O$
BDEAS Bis(diethylamino)silane $SiH_2(NEt_2)_2$
BDMAS Bis(dimethylamino)silane $SiH_2(NMe_2)_2$
TriDMAS Tris(dimethylamino)silane $SiH(NMe_2)_3$
Bis(trimethylsilylamino)silane $SiH_2(NHSiMe_3)_2$
TICS Tetra(isocyanato)silane $Si(NCO)_4$
TEAS Tetrakis(ethylamino)silane $Si(NHEt)_4$
TEOS Tetrakis(ethoxy)silane $Si(OEt)_4$
BTESE Bis(triethoxysilyl)ethane $(EtO)_3Si-CH_2-CH_2-Si(OEt)_3$
TAS Tetra(acetoxy)silane $Si(-O-C(=O)-Me)_4$ This invention also provides a method of forming silicon oxide films that inhibits or prevents OH bond introduction during film formation at low temperatures not higher than 500° C., wherein the thickness of the silicon oxide film is easily controlled and the silicon oxide film is highly reliable, for example, reducing the leakage current when applied to a gate electrode side surface.

The method of the invention also provides a $SiO_2$ film, particularly when deposited using the ALD process with nitrogen purge between each injection, has a very high conformality (i.e. the ability to deposit uniform films in the top and the bottom of a trench) useful in gap-fill applications or for capacitors electrode for DRAM, i.e. films which fill out all the cavities on a surface and provide a uniform $SiO_2$ layer.

PREFERRED EMBODIMENTS

The method according to the invention for forming silicon oxide films is described in details herein below. It comprises:

the use of an oxygen source and an aminosilane of the general formula $(R^1R^2N)_xSiH_{4-x}$, where x is comprised between 1 and 4, where $R^1$ and $R^2$ are independently H or a $C_1$-$C_6$ linear, branched or cyclic carbon chain, are independently introduced in the reactor continuously or by pulses. Preferably injected through an ALD process. Preferably the alkylaminosilane is bis(diethylamino)silane (BDEAS), bis(dimethylamino)silane (BDMAS) or tris(dimethylamino)silane (TriDMAS). The alkylaminosilane is adsorbed on the surface of the substrate (at the initial stage, this step prevents the possible oxidation of the underlying metal electrode during the introduction of the oxygen source). After a purge time to evacuate the aminosilane from the reactor using an inert gas, an oxygen source, which may consist of an oxygen/ozone gas mixture (typically: 5-20% vol. of ozone in oxygen), oxygen, moisture and/or hydrogen peroxide ($H_2O_2$) or a combination thereof, is introduced by pulses. A cycle then consists of one pulse of the aminosilane, one pulse of purging gas, one pulse of the oxygen containing gas, one pulse of purging gas. The number of cycles is determined by the targeted thickness, taking into account the deposition rate per cycle obtained at given experimental conditions. The deposition temperature can be as low as room temperature and up to 500° C., with an operating pressure of 0.1-100 Torr (13 to 13300 Pa). High quality films, with very low carbon and hydrogen contents, are preferably deposited between 200 and 400° C. at a pressure between 0.1-10 Torr (13 to 1330 Pa).

the use of an oxygen source and an alkoxysilane or acetoxysilane having the formula $Si(OR^1)(OR^2)(OR^3)(OR^4)$, or $(OR^1)(OR^2)(OR^3)SiSi(OR^4)(OR^5)(OR^6)$, or, $(OR^1)(OR^2)(OR^3)SiRSi(OR^4)(OR^5)(OR^6)$, or $Si(0-C(=0)-R^1)(0-C(=0)-R^2)(0-C(=0)-R^3)(0-C(=0)-R^4)$, preferably tetra(acetoxy)silane $Si(0-C(=0)-Me)_4$ wherein R, $R^1$, $R^2$, $R^3$, $R^4$ $R^5$, $R^6$ are independently H, O, $C_1$-$C_6$ linear, branched or cyclic carbon chain, are independently introduced in the reactor continuously or by pulses. Preferably injected through an ALD process. Preferably the alkoxysilane is $(EtO)_3Si-CH_2-CH_2-Si(OEt)_3$ (BTESE). The alkoxysilane is adsorbed on the surface of the substrate (at the initial stage, this step prevents the possible oxidation of the underlying metal electrode during the introduction of the oxygen source). After a purge time to evacuate the aminosilane from the reactor using an inert gas, an oxygen source, which may consist of an oxygen/ozone gas mixture (typically: 5-20% vol. of ozone in oxygen), oxygen, moisture and/or hydrogen peroxide ($H_2O_2$) or a combination thereof, is introduced by pulses. A cycle then consists of one pulse of the alkoxysilane, one pulse of purging gas, one pulse of the oxygen containing gas, one pulse of purging gas. The number of cycles is determined by the targeted thickness, taking into account the deposition rate per cycle obtained at given experimental conditions. The deposition temperature can be as low as room temperature and up to 500° C., with an operating pressure of 0.1-100 Torr (13 to 13300 Pa). High quality films, with very low carbon and hydrogen contents, are preferably deposited between 200 and 400° C. at a pressure between 0.1-10 Torr (13 to 1330 Pa).

the use of an oxygen source and tetra(isocyanato)silane having the formula $Si(NCO)_4$, are independently introduced in the reactor continuously or by pulses. Preferably injected through an pulse-CVD process. The isocyanatosilane is adsorbed on the surface of the substrate (at the initial stage, this step prevents the possible oxidation of the underlying metal electrode during the introduction of the oxygen source). After a purge time to evacuate the silane compound from the reactor using an inert gas, an oxygen source, which may consist of an oxygen/ozone gas mixture (typically: 5-20% vol. of ozone in oxygen), oxygen, moisture and/or hydrogen peroxide ($H_2O_2$) or a combination thereof, is introduced by pulses. A cycle then consists of one pulse of the isocyanatosilane, one pulse of purging gas, one pulse of the oxygen containing gas, one pulse of purging gas. The number of cycles is determined by the targeted thickness, taking into account the deposition rate per cycle obtained at given experimental conditions. The deposition temperature can be as low as room temperature and up to 500° C., with an operating pressure of 0.1-100 Torr (13 to 13300 Pa). High quality films, with very low carbon and hydrogen contents, are preferably deposited between 200 and 400° C. at a pressure between 0.1-10 Torr (13 to 1330 Pa).

the use of an oxygen source, silane (silane, disilane, trisilane, trisilylamine) of the general formula $(SiH_3)_xR$ where x may vary from 1 to 4 and wherein R is selected from the comprising H, N, O, $CH_2$, $CH_2$—$CH_2$, $SiH_2$, SiH, Si with the possible use of a catalyst in ALD regime. Preferably the silane is a C-free silane. Most preferably, the silane is trisilylamine. A very small amount (<1%) of catalyst may be introduced into the reactor. The silanes described above are difficult to use in ALD conditions, as their adsorption on a silicon wafer is not favorable. The use of a catalyst helps the adsorption of silane on the substrate or the underlying layer. After a purge cycle time to evacuate the silane from the reactor using an inert gas, an oxygen source, which can consist of an oxygen/ozone gas mixture (typically: 5-20% vol. of ozone in oxygen), oxygen, moisture and/or hydrogen peroxide ($H_2O_2$) and any combination thereof, is introduced by pulses. A cycle then consists of one pulse of the catalyst, one pulse of purging gas, one pulse of a silane, one pulse of purging gas, one pulse of the oxygen source, one more purging time. Possibly, the introduction of the catalyst is done simultaneously with the silane, hence reducing the number of steps during the cycle, and then its duration. The catalyst is an amine or a metal-containing molecule, preferably a molecule containing an early transition metal, most preferably a hafnium-containing molecule, such as $Hf(NEt_2)_4$. For some applications, the catalyst shall be C-free. The use of halides or nitrates is therefore suggested, for instance $HfCl_4$ or $Hf(NO_3)_4$. The number of cycles is determined by the targeted thickness, taking into account the deposition rate per cycle obtained at given experimental conditions. The deposition temperature can be as low as room temperature and up to 400° C., with an operating pressure of 0.1-100 Torr. High quality films, with very low carbon and hydrogen contents, are preferably deposited at temperature between 2001500° C., and at pressures between 0.1-10 Torr.

Preferably, the method according to the invention is carried out as follows:

After a substrate has been introduced into a reaction chamber, the gas within the chamber is first purged by feeding an inert gas into the reaction chamber under reduced pressure at a substrate temperature of 50 to 400° C. Then, while at the same temperature and under reduced pressure, a pulse of a gaseous silicon compound is delivered into the reaction chamber and a very thin layer of this silicon compound is formed on the treatment substrate by adsorption. This is followed by feeding an inert gas into the reaction chamber in order to purge therefrom unreacted (unadsorbed) silicon compound, after which a pulse of oxygen-containing gas is delivered into the reaction chamber. The ozone-containing gas oxidizes the very thin layer of silicon compound adsorbed on the substrate, thereby forming a very thin layer of silicon oxide and inert gas is injected into the reaction chamber to purge unreacted products. A silicon oxide film is formed on to the substrate at the desired thickness, by repeating this sequence of inert gas purge, gaseous silicon compound pulse, inert gas purge, and oxygen-containing mixed gas pulse.

Preferably, the substrate shall be a silicon wafer (or SOI) used for the manufacture of semiconductor devices, or layers deposited thereon, or a glass substrate used for the manufacture of liquid crystal display devices, or layers deposited thereon. A semiconductor substrate on which a gate electrode has been formed is used as the substrate in particular when the silicon oxide film is used for the purpose of improving the gate breakdown voltage.

The reduced pressure in the chamber is preferably comprised between 0.1 to 1000 torr (13 to 1330 kPa) and more preferably 1 to 10 torr (133 to 1330 kPa).

The reduced pressure in the chamber is preferably comprised between 0.1 to 1000 torr (13 to 1330 kPa) and more preferably 1 to 10 torr (133 to 1330 Pa).

The substrate temperature shall be preferably at least 50° C. and at most 500° C., more preferably comprised between 200 and 400° C., while 250 to 350° C. is even more preferred.

The inert gas used with the method of the invention shall be preferably nitrogen, argon and/or helium.

The aforementioned silicon compound can be exemplified by silicon hydrides such as silane $[SiH_4]$, disilane $[(SiH_3)_2]$, trisilane $[(SiH_3)_2SiH_2]$, alkylsilane $[(SiH_3)_nR$ where R represents $C_1$ to $C_6$ straight-chain, branched, or cyclic alkane], trisilylamine $[(SiH_3)_3N]$, and disiloxane $[(SiH_3)_2O]$; silicon alkoxides such as TEOS $[Si(OC_2H_5)_4]$, TMOS $[Si(OCH_3)_4]$, bistriethoxysilylethane, and trialkylsilylalkane $[(RO)_3Si-Alk-Si(OR)_3$ where R is $C_1$ to $C_6$ alkane], isocyanatosilane $Si(NCO)_4$, acetoxysilane $(Si(—O—C(=O)—CH_3)_4$ and BDEAS $(SiH_2(NEt_2)_2)$ The silicon compound is preferably pulsed into the reaction chamber from, for example, a cylinder when it is gaseous at ambient temperature. When the silicon compound is a liquid at ambient temperature, as in the case of TEOS, it can be pulsed into the chamber using a bubbler technique. Specifically, a solution of the silicon compound is placed in a container, heated as needed, entrained in an inert gas (for example, nitrogen, argon, helium) by bubbling the inert gas therethrough using an inert gas bubbler tube placed in the container, and is introduced into the chamber. A combination of a liquid mass flow controller and a vaporizer can also be used.

The oxygen-containing mixed gas oxidizes the silicon compound and converts it into silicon oxide. This mixed gas can be exemplified by a mixed gas of ozone and oxygen and by a mixed gas of ozone plus oxygen plus an inert gas such as nitrogen, argon, or helium. The ozone concentration in this mixed gas is preferably 0.1 to 20% vol. An ozone concentration less than 0.1% vol. creates the likelihood of problems with effecting a thorough oxidation of the monoatomic layer of the silicon compound at low temperatures. An ozone concentration above 20%, on the other hand, creates the likelihood of problems with handling due to the associated toxicity, instability and hazardousness of ozone.

A pulse of gaseous silicon compound can be delivered into the reaction chamber, for example, for 0.1 to 10 seconds at a flow rate of 1.0 to 100 sccm. The pulse of oxygen-containing gas can be delivered into the reaction chamber, for example, for 0.1 to 10 seconds at a flow rate of 10 to 1000 sccm.

BRIEF DESCRIPTION OF THE DRAWINGS

The invention will now be described in details with reference to the following drawings.

Figure 1:
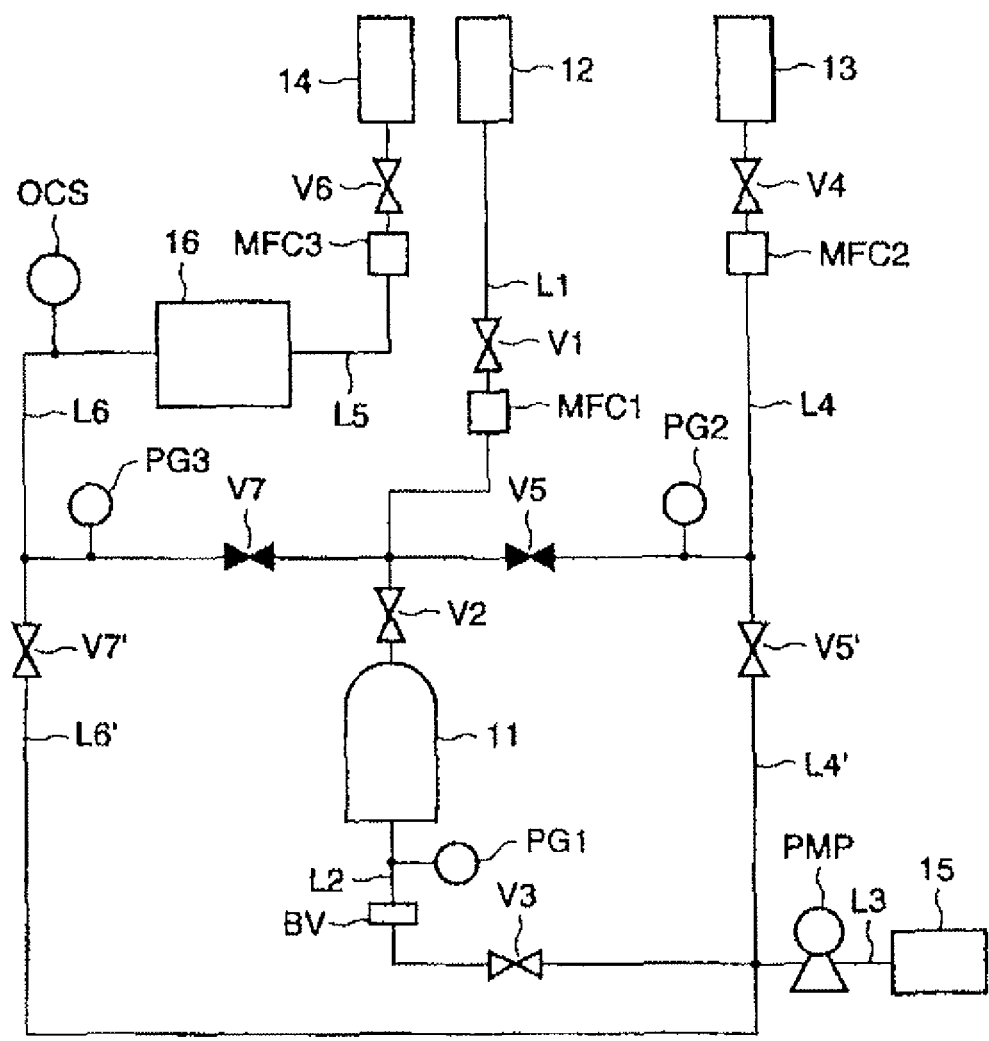
FIG. 1 is a schematic diagram of a film-forming apparatus used in a film-forming method according to an embodiment of the invention (during an inert gas purge injection).

On FIG. 1, the film-forming apparatus is provided with a reaction chamber 11; a nitrogen gas cylinder 12, which is a source of an inert gas feed (for example, nitrogen gas); an Si compound gas cylinder 13, which is a source of a feed of gaseous Si compound; and an oxygen cylinder 14, which is a source of a oxygen gas feed. In the case of a single-wafer apparatus, a susceptor (not shown) is disposed within the reaction chamber 11 and one semiconductor substrate (not shown), for example, a silicon substrate, is mounted thereon. A heater is provided within the susceptor in order to heat the semiconductor substrate to the specified reaction temperature. In the case of a batch-type apparatus, from 5 to 200 semiconductor substrates are held within the reaction chamber 11. The heater in a batch-type apparatus may have a different structure from the heater in a single-wafer apparatus.

The nitrogen gas cylinder 12 is connected through a line L1 to the reaction chamber 11. A shutoff valve V1 and a flow rate controller, for example, a mass flow controller MFC1, are provided in the line L1 in the order given considered from the upstream side. A shutoff valve V2 is also provided in the line L1 in the vicinity of the reaction chamber 11.

An exhaust line L2 that extends to a vacuum pump PMP is provided at the bottom of the reaction chamber 11. A pressure gauge PG1, a butterfly valve BV for backpressure control, and a shutoff valve V3 are provided in the line L2 in the order given considered from the upstream side. The vacuum pump PMP is connected through a line L3 to a detoxification apparatus 15. This detoxification apparatus 15 can be, for example, a combustion-type detoxification apparatus or a dry-type detoxification apparatus, in correspondence to the gas species and levels thereof.

The Si compound gas cylinder 13 is connected through a line L4 to the line L1 upstream from the shutoff valve V2 (between the shutoff valve V2 and the mass flow controller MFC1). A shutoff valve V4, a mass flow controller MFC2, a pressure gauge PG2, and a shutoff valve V5 are disposed in the line L4 in the order given considered from the upstream side. The line L4 branches upstream from the pressure gauge PG2 and the resulting branch line L4' is connected to the exhaust line L2 upstream from the vacuum pump PMP (between the vacuum pump PMP and the shutoff valve V3). A shutoff valve V5' is provided in the branch line L4'. The states of the shutoff valves V5 and V5' are synchronized in such a manner that when one is open the other is closed.

The oxygen cylinder 14 is provided with a line L5 that extends to an ozone generator 16; this line L5 is provided with a shutoff valve V6 and a mass flow controller MFC3 in the order given considered from the upstream side. The ozone generator 16 is connected through a line L6 with the line L1 upstream from the shutoff valve V2 (between the shutoff valve V2 and the mass flow controller MFC1). An ozone concentration sensor OCS, a pressure gauge PG3, and a shutoff valve V7 are provided in the line L6 in the order given considered from the upstream side. The line L6 is also branched upstream from the pressure gauge PG3, and the resulting branch line L6' is connected to the exhaust line L2 upstream from the vacuum pump PMP (between the vacuum pump PMP and the shutoff valve V3). A shutoff valve V7' is provided in the branch line L6'. The states of the shutoff valves V7 and V7' are synchronized in such a manner that when one is open the other is closed.

A mixed gas of oxygen and ozone produced by the ozone generator 16 flows into the line L6. At a constant oxygen gas feed flow rate, control of the ozone concentration in the mixed gas depends mainly on pressure and the power applied to the ozone generator 16. As a consequence, the ozone concentration is controlled by measuring the ozone level with an ozone concentration sensor OCS disposed in the line L6 and subjecting the applied power and vessel pressure of the ozone generator 16 to feedback control based on this measured value.

An embodiment of the method for forming silicon oxide films is described hereinbelow using the film-forming apparatus described on FIGS. 1 to 3.

1) Nitrogen Gas Purge

A treatment substrate, for example, a semiconductor wafer (not shown), is mounted on the susceptor within the reaction chamber 11 and the wafer is heated to 50 to 400° C. by a temperature regulator incorporated in the susceptor. As shown in FIG. 1, the shutoff valves V5 and V7 are closed and the other shutoff valves V1 to V4, V6, V5', and V7' are all open. The closed control valves are shown filled in black in FIG. 1, while the open control valves are shown in white. The status of the shutoff valves in the following description is shown in the same manner.

Then, while exhausting the gas within the reaction chamber 11 through the exhaust line L2 by the operation of the vacuum pump PMP, nitrogen gas is introduced from the nitrogen gas cylinder 12 through the line L1 and into the reaction chamber 11 under feed flow rate control by the mass flow controller MFC1. A nitrogen gas purge is thereby carried out at a desired vacuum (for example, 0.1 to 1000 torr) by exhausting the gas within the reaction chamber 11 and feeding nitrogen gas into the reaction chamber 11 and the interior of the reaction chamber 11 is substituted by nitrogen gas.

Beginning with and continuing from the above-described nitrogen gas purge step, Si compound gas is continuously fed into the line L4 from the Si compound gas cylinder 13 under feed flow rate control by the mass flow controller MFC2. However, during the nitrogen gas purge step described above, the shutoff valve V5, which resides in the line L4 that connects to the line L1 that extends to the reaction chamber 11, is closed and the shutoff valve V5', which resides in the branch line L4' that connects to the exhaust line L2, is open, and as a result this Si compound gas is not fed into the reaction chamber 11 during the nitrogen gas purge step, but rather is exhausted by feed through the lines L4 and L4' into the exhaust line L2.

In addition, beginning with and continuing from the above-described nitrogen gas purge step, oxygen gas is continuously fed through the line L5 from the oxygen gas cylinder 14 to the ozone generator 16 under feed flow rate control by the mass flow controller MFC3. A desired power level is applied to the ozone generator 16, and oxygen containing ozone at a desired concentration (the mixed gas) is fed into the line L6 from the ozone generator 16 while measuring the ozone level with the ozone concentration sensor OCS provided in the line L6, through which the mixed gas of ozone and oxygen flows, and exercising feedback control of the applied power and the vessel pressure of the ozone generator 16 based on the resulting measured value. However, during the nitrogen gas purge step described above, the shutoff valve V7, which resides in the line L6 that connects to the line L1 that extends to the reaction chamber 11, is closed and the shutoff valve V7', which resides in the branch line L6' that connects to the exhaust line L2, is open, and as a result this ozone+oxygen mixed gas is not fed into the reaction chamber 11 during the nitrogen gas purge step, but rather is exhausted by feed through the lines L6 and L6' into the exhaust line L2.

2) Si Compound Gas Pulse

Figure 2:
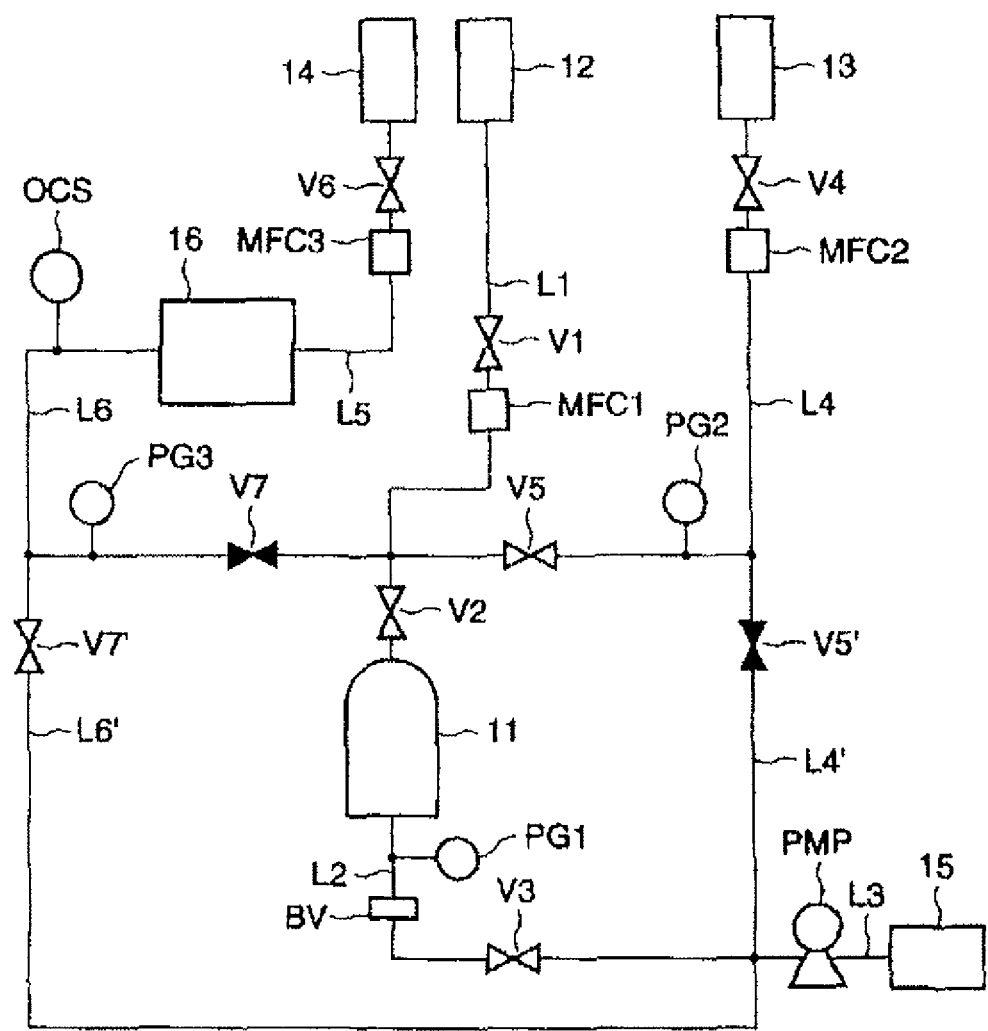
FIG. 2 is a schematic diagram of the film-forming apparatus of FIG. 1, during an Si compound gas injection.

Proceeding from the state shown in FIG. 1, the shutoff valve V5' in the branch line L4' is closed and, in synchrony with this operation, the shutoff valve V5 in the line L4 is opened, as shown in FIG. 2. After a desired period of time, the status of each of these shutoff valves V5 and V5' is then reversed. During the interval in which the shutoff valve V5 is open, Si compound gas from the Si compound gas cylinder 13 is fed under flow rate control from the line L4 into the line L1 and is pulsed into the reaction chamber 11 along with nitrogen gas. This pulse results in the adsorption of an approximately monomolecular layer of the Si compound on the heated surface of the semiconductor wafer mounted on the susceptor in the reaction chamber 11.

3) Nitrogen Gas Purge

After the Si compound gas pulse has been delivered, a nitrogen gas purge is carried out as in FIG. 1 by reversing the status of the shutoff valves V5 and V5' in the line L4 and the branch line L4' from the status in FIG. 2. When this is done, the unreacted Si compound remaining in the reaction chamber 11 is exhausted by means of the nitrogen gas and the interior of the reaction chamber 11 is again substituted by nitrogen gas.

4) Ozone+Oxygen Mixed Gas Pulse

Figure 3:
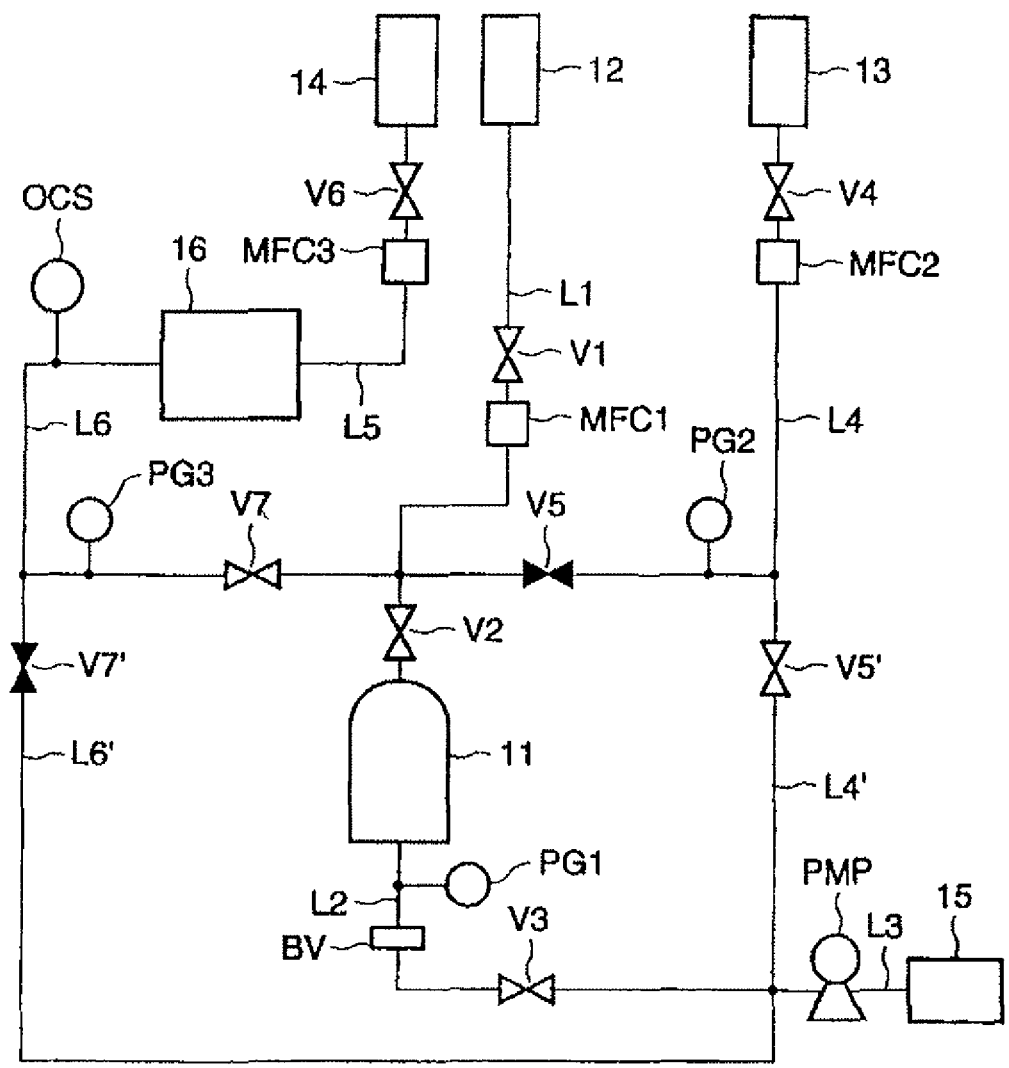
FIG. 3 is a schematic diagram of the film-forming apparatus of FIG. 1 during the injection of an ozone/oxygen gas pulse.

Proceeding from the state shown in FIG. 1, the shutoff valve V7' in the branch line L6' is closed and, in synchrony with this operation, the shutoff valve V7 in the line L6 is opened, as shown in FIG. 3. After a desired period of time, the status of each of these shutoff valves V7 and V7' is then reversed. During the interval in which the shutoff valve V7 is open, the mixed gas of ozone and oxygen, supra, is fed from the line L6 into the line L1 and is pulsed into the reaction chamber 11 along with nitrogen gas. As a result of this pulse, the Si compound adsorbed on the heated surface of the semiconductor wafer mounted on the susceptor in the reaction chamber 11 is oxidized by the ozone+oxygen mixed gas, resulting in the formation on the surface of the semiconductor wafer of a silicon oxide film in the form of an approximately monomolecular layer.

A silicon oxide film of desired thickness is formed on the surface of the semiconductor wafer by repeating these steps of 1) nitrogen gas purge, 2) Si compound gas pulse, 3) nitrogen gas purge, and 4) ozone+oxygen mixed gas pulse. After 4) delivery of the ozone+oxygen mixed gas pulse, a nitrogen gas purge is carried out as in FIG. 1 by reversing the status of the shutoff valves V7 and V7' in the line L6 and the branch line L6' from the status in FIG. 3. When this is done, reaction by-products and the unreacted ozone+oxygen mixed gas remaining in the reaction chamber 11 are exhausted by means of the nitrogen gas and the interior of the reaction chamber 11 is again substituted by nitrogen gas.

An Si compound that is gaseous at ambient temperature is used as an example of the gaseous Si compound in silicon oxide film formation using the film-forming apparatus shown in FIGS. 1 to 3 and described above. However, when an Si compound is used that is liquid at ambient temperature, such as TEOS, gaseous Si compound can still be introduced into the reaction chamber 11 using a bubbler procedure. In specific terms, a bubbler is provided in place of the Si compound gas cylinder 13 shown in FIGS. 1 to 3 and this bubbler is connected to a branch line branched off upstream from the valve V1 in the nitrogen gas-carrying line L1, making it possible to repeat the steps of 1) nitrogen gas purge, 2) Si compound gas pulse, 3) nitrogen gas purge, and 4) ozone+oxygen mixed gas pulse.

One reactant can be introduced continuously while the other can be introduced by pulses (pulsed-CVD regime).

In accordance with the preceding embodiment, by inducing the adsorption, through the delivery of a pulse of Si compound gas, of an approximately monomolecular layer of Si compound on the surface of the treatment substrate heated to a relatively low temperature no greater than 400° C. and then, after an inert gas (for example, nitrogen gas) purge, delivering a pulse of ozone-containing mixed gas (for example, an ozone+oxygen mixed gas), the thorough oxidation of the Si compound adsorbed on the surface of the treatment substrate by the strong oxidizing action of the ozone in the mixed gas enables the formation of a silicon oxide film in the form of an approximately monomolecular layer. In addition, the implementation of an inert gas (for example, nitrogen gas) purge after the oxidation reaction makes it possible to prevent the adsorption of moisture within the reaction chamber by the silicon oxide film that has been formed. This enables the formation of an excellent silicon oxide film for which OH bond introduction has been inhibited or prevented. Such a silicon oxide film has, for example, an excellent performance with regard to low leakage current.

Moreover, since the Si compound adsorbed on the surface of the treatment substrate is oxidized by a pulse of a mixed gas containing a suitable amount of ozone (for example, a concentration of 5 to 20%), oxidation to the surface of the treatment substrate, which has been confirmed for the use of ozone-containing mixed gas by CVD methods, can be prevented. There is little effect on the treatment substrate since the required amount of this ozone-containing mixed gas is introduced as a pulse at low temperatures. This makes it possible to submit a treatment substrate bearing a film intolerant to high temperatures or an easily oxidizable metal film or metal silicide film to formation of a silicon oxide film according to the embodiment.

Figure 4:
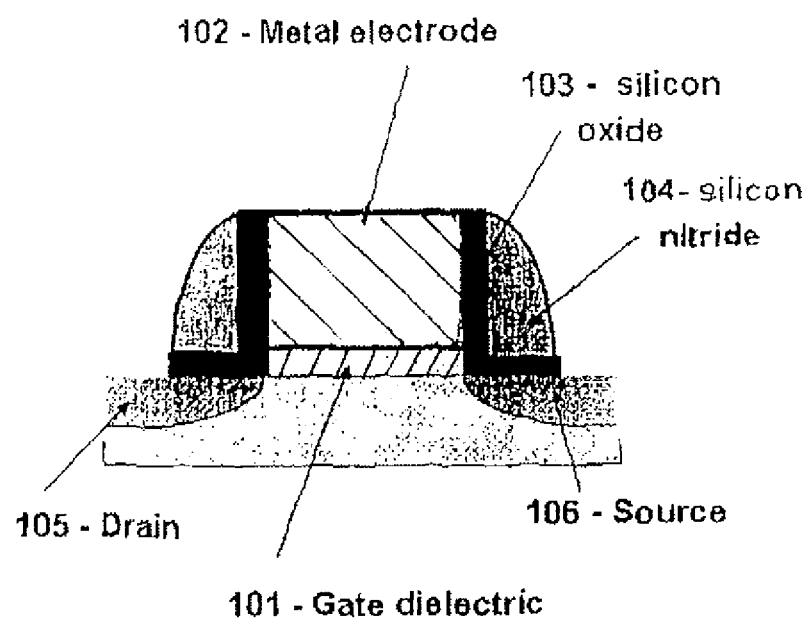
FIG. 4 is a view a metal gate of a MOS transistor with $SiO_2$ films deposited according to the invention.

On FIG. 4 is illustrated a side view of a MOS transistor comprising a $SiO_2$ layer according to the invention. On the wafer 100, above the respective drain 105 and source 106 is located the gate 101 in the gate dielectric material with the metal electrode 102 deposited above 101. Protective silicon oxide films 103 are laterally placed on the lateral ends of the gate 101 and metal gate electrode 102.

$SiO_2$ films 103 are also deposited on the top of the source 106 and the drain 105.

Examples of the invention are described below with reference to the FIGS. 1 to 4:

EXAMPLE 1

The film-forming apparatus shown in the hereinabove-described FIGS. 1 to 3 was used. A silicon wafer was positioned on the susceptor in the reaction chamber 11 and the wafer was heated to 100° C. A silicon oxide film was formed by repeating the steps of 1) nitrogen gas purge, 2) Si compound gas pulse, 3) nitrogen gas purge, and 4) ozone+oxygen mixed gas pulse according to the hereinabove-described embodiment using the conditions described below.

1) Nitrogen Gas Purge
   pressure within the reaction chamber: 3 torr
   nitrogen gas feed flow rate: 130 sccm
   nitrogen gas purge time: 6 seconds
2) Si Compound Gas Pulse
   pressure within the reaction chamber: 3 torr
   Si compound gas: trisilylamine (TSA) gas
   TSA gas feed flow rate: 2 sccm
   TSA pulse time: 1 second
3) Nitrogen Gas Purge
   pressure within the reaction chamber: 3 torr
   nitrogen gas feed flow rate: 130 sccm
   nitrogen gas purge time: 6 seconds
4) Ozone+Oxygen Mixed Gas Pulse
   pressure within the reaction chamber: 3 torr
   feed flow rate of the ozone+oxygen mixed gas (5% ozone conc.): 20 sccm
   mixed gas pulse time: 2 seconds

EXAMPLE 2

A silicon oxide film was formed by the same method as in Example 1, but in this case heating the silicon wafer placed on the susceptor within the reaction chamber 11 to 200° C.

EXAMPLE 3

A silicon oxide film was formed by the same method as in Example 1, but in this case heating the silicon wafer placed on the susceptor within the reaction chamber 11 to 300° C.

The thickness of the silicon oxide film was measured at each cycle of the instant film-forming procedure in Examples 1 to 3 (Example 1 was carried through 50 cycles). A silicon oxide film could be formed in Examples 1 to 3 with good thickness control without an incubation period at a rate of about 1.2-1.7 A/cycle.

In addition, FT-IR analysis was carried out on the silicon oxide film produced in Example 3 after 200 cycles (wafer temperature: 300° C.). It was confirmed that film production at the low temperature of 300° C. could provide an excellent silicon oxide film in which OH bond introduction is prevented.

Using a silicon wafer bearing a molybdenum thin film on its surface as the sample, a silicon oxide film was formed on the surface of the molybdenum thin film using the same method as in Examples 1 to 3 (100 cycles). This was followed by an examination of the status of the molybdenum thin film, which formed the underlayer for the silicon oxide film. Oxidation of the molybdenum thin film was not observed, even though an ozone+oxygen mixed gas (ozone concentration=5%) was used as the oxidizing gas.

EXAMPLE 4

ALD Deposition of $SiO_2$ Films Using BDEAS and Ozone

Films were successfully deposited on silicon and iridium by ALD using BDEAS and a mixture of ozone/oxygen, using the set-up of FIGS. 1 to 3.

The chamber was a hot-wall reactor heated by conventional heater. The ozonizer produced the ozone and its concentration was approximately 150 g/m$^3$ at −0.01 MPaG. BDEAS (Bis(diethylamino)silane, $SiH_2(NEt_2)_2$) was introduced to the reaction chamber 11 by the bubbling of an inert gas (nitrogen) into the liquid aminosilane. Experimental conditions were:

7.0 sccm $O_3$
93 sccm $O_2$
BDEAS: 1 sccm [in the range of 1 to 7 sccm]
$N_2$: 50 sccm
Temperature ranging between 200 and 400 C
Operating pressure: 1 Torr [in the range of 0.1 to 5 Torr]
Purge and pulse times were typically set at 5 seconds each.
The number of cycles was typically set to 600 cycles.

Experiments were performed in order to determine films characteristics such as deposition rate, deposition temperature, film quality and film composition.

$SiO_2$ films were obtained on Si wafer. Depositions at 200, 250, 300, 350 and 400° C. were carried out. The deposited films did include neither nitrogen nor carbon according to in-depth analysis by Auger.

$SiO_2$ films deposited Number of cycles were varied (350, 600 and 900 cycles deposition tests) and $SiO_2$ films deposited to check that there was no or negligible incubation time.

Depositions on iridium were performed in order to observe the possible oxidation of the metal electrode. The Auger profile shows a sharp interface between ALD $SiO_2$ and iridium substrate, and therefore no metal oxidation was observed.

EXAMPLE 5

ALD Deposition of $SiO_2$ Films Using BDMAS and Ozone

Similar experiments were carried out in the same conditions as in example 4. High quality films were obtained at a deposition rate of 0.3 A/cycle at 1 Torr between 250 and 300 C.

EXAMPLE 6

ALD Deposition of $SiO_2$ Films Using TriDMAS and Ozone

Similar experiments were carried out in the same conditions as in example 4. High quality films were obtained at a deposition rate of 0.2 A/cycle at 1 Torr between 250 and 300 C.

EXAMPLE 7

ALD Deposition of $SiO_2$ Films Using TSA, Ozone and a Catalyst [$Hf(NEt_2)_4$]

Films were successfully deposited on silicon by ALD by alternatively introducing $Hf(NEt_2)_4$ diluted in nitrogen, $N_2$, TSA, $N_2$, and an ozone/oxygen $O_3/O_2$ mixture (nitrogen bubbling through a mass flow controller into $Hf(NEt_2)_4$ provides a mixture of this catalyst and $N_2$ which is alternatively introduced in a similar way into the reactor 11).

The chamber is a hot-wall tubular reactor heated by a conventional heater. BDEAS was introduced to furnace by the bubbling of an inert gas (nitrogen) into the liquid aminosilane. Typical experimental conditions are:

4 sccm $O_3$
96 sccm $O_2$
TSA: 1 sccm [in the range of 1 to 7 sccm]
$N_2$: 100 sccm
Temperature: 400 C
Operating pressure: 5 Torr
Pulse durations were typically set at 5 seconds each and pulse duration 10 seconds
The number of cycles was 44 cycles.

A thin film of silicon oxide with no detectable level of hafnium was observed by Auger spectroscopy.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method of forming a silicon oxide film comprising the steps of:
    a) providing a substrate into a reaction chamber;
    b) injecting into the reaction chamber at least one silicon containing compound where the at least one silicon containing compound is bis(diethylamino)silane;

c) injecting into the reaction chamber Oxygen and at least one O-containing gas selected from ozone and water;

d) reacting in the reaction chamber by chemical vapor deposition at a temperature below 400 C the at least one silicon containing compound and the oxygen and at least one oxygen containing gas in order to obtain the silicon oxide film deposited onto the substrate.

2. The method of claim 1, wherein the silicon oxide film forms shallow trench insulation.

3. The method of claim 1, wherein the silicon oxide film forms an inter layer dielectric.

4. The method of claim 1, wherein the silicon oxide film forms a passivation layer.

5. The method of claim 1, wherein the silicon oxide film forms an etch stop layer.

6. The method of claim 1, wherein the silicon oxide film forms part of a dual spacer.

7. The method of claim 1, wherein the temperature is below 300 C.

\* \* \* \* \*